United States Patent
Yushan et al.

(10) Patent No.: US 6,353,345 B1
(45) Date of Patent: Mar. 5, 2002

(54) LOW COST HALF BRIDGE DRIVER INTEGRATED CIRCUIT WITH CAPABILITY OF USING HIGH THRESHOLD VOLTAGE DMOS

(75) Inventors: Li Yushan, Ossining, NY (US); Stephen L. Wong, Saratoga, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/543,017

(22) Filed: Apr. 4, 2000

(51) Int. Cl.[7] .............................. H03B 1/00; H03K 3/00
(52) U.S. Cl. ..................... 327/112; 327/108; 327/390; 326/80; 326/87
(58) Field of Search ..................... 327/108–112, 588, 327/589, 423, 424, 390, 170, 83, 86; 326/87, 88, 81, 80; 361/111, 118

(56) References Cited

U.S. PATENT DOCUMENTS

| | | | |
|---|---|---|---|
| 5,126,911 A | * 6/1992 | Contiero et al. ............... 361/84 |
| 5,246,870 A | 9/1993 | Merchant ...................... 437/21 |
| 5,300,448 A | 4/1994 | Merchant et al. ............. 437/41 |
| 5,365,118 A | * 11/1994 | Wilcox ......................... 327/109 |
| 5,543,740 A | * 8/1996 | Wong ........................... 327/108 |
| 5,552,731 A | * 9/1996 | Diazzi et al. ................ 327/109 |
| 5,572,156 A | * 11/1996 | Diazzi et al. ................ 327/109 |
| 5,587,676 A | * 12/1996 | Chowdhury .................. 327/108 |
| 5,742,196 A | * 4/1998 | Fronen et al. ............... 327/108 |
| 5,973,368 A | * 10/1999 | Pearce et al. ................ 257/384 |
| 6,037,720 A | * 3/2000 | Wong et al. ................. 327/108 |
| 6,043,970 A | * 3/2000 | Song et al. .................. 361/111 |
| 6,150,853 A | * 11/2000 | Chrappan et al. ........... 327/108 |
| 6,211,706 B1 | * 4/2001 | Choi et al. .................. 327/108 |

* cited by examiner

*Primary Examiner*—Terry D. Cunningham
*Assistant Examiner*—Long Nguyen

(57) ABSTRACT

A low cost half bridge driver IC fabricated in the process technology with a minimum or reduced number of masking steps to implement all the blocks and without the use of the low threshold voltage CMOS. The half bridge driver IC uses a universal 12 Volt supply for all of the blocks with reference to the ground or to the half bridge output. Furthermore, the low differential current from high voltage level shifter transistors of the half bridge driver IC can provide enough voltage swing to set or reset the latch when high threshold voltage DMOS transistors are used in the pulse filter.

20 Claims, 6 Drawing Sheets

LOW COST HALF BRIDGE DRIVER INTEGRATED CIRCUIT WITH CAPABILITY OF USING HIGH THRESHOLD VOLTAGE DMOS

BACKGROUND OF THE INVENTION

FIELD OF THE INVENTION

The invention relates to half bridge driver integrated circuits. More particularly, this invention relates to the preparation of a high voltage half bridge integrated circuit with level shifting input control where all complementary metal oxide semiconductor (CMOS) components have been replaced with N- and P-channel double diffused metal oxide semiconductor (DMOS) components.

A high voltage, half bridge integrated circuit (IC) with level shifting input control serves a very important function that is used ubiquitously in many areas of power and control electronics. Presently this function is integrated using full mask silicon on insulator (SOI) technology that requires numerous masking steps to implement.

A half bridge driver integrated circuit (IC), such as the one shown in FIG. 1 and identified by the numeral 1, typically comprises two, i.e., high and low, power metal oxide silicon (MOS) field effect transistor (FET) or insulated gate bipolar transistor (IGBT) switches 11, 12. The half bridge driver IC 1 further comprises a circuit 2 used for generating two square wave signals to control the timing of conduction time to power switches 11, 12. This circuit 2 is called a "non-overlap" circuit since signals from circuit 2 conducted to power switches 11, 12 are controlled so that the switches 11, 12 do not "overlap," that is they are not switching on at the same time. The dead time between the two signals avoids any cross conduction of the two power switches 11, 12 and prevents the simultaneous switching on of both these power switches 11, 12.

The half bridge driver IC 1 further comprises two high voltage level shifter MOSFET transistors 5a, 5b, each of these level shifter transistors being connected with a distinct current source 4a, 4b. Each of the distinct current sources receives separate Ion and Ioff voltage pulses from a circuit 3, called the pulse generator circuit, which is used to generate short voltage pulses. The pulse generator circuit 3 generates two short pulses to control the on time switch of the current sources 4a, 4b. Short pulses instead of long ones are used in order to reduce the level shifting power dissipation. Pulses from the pulse generator circuit 3 are sent to the two current sources 4a, 4b, which are switched on or off according to the input pulse.

Current passage is allowed from each current source 4a, 4b through respective transistors 5a, 5b, which may have ranges of up to a few hundred Volts and are used to communicate between the ground reference level and high voltage reference level, e.g., 500 Volt. These transistors 5a, 5b may sustain a high voltage across their drain and source. Other devices such as regular CMOS or DMOS are not able to handle such high voltage.

A pulse filter circuit 6 receives short current pulses initiated by the current sources and passed by the level shifter transistors. In its turn the pulse filter circuit 6 generates two voltage levels to activate a latch or flip flop 7 which, according to its received input signals, sends an on or off output signal to switch the high power switch 11 on and off even in the presence of a large common mode current arising from dv/dt coupling. A high side driver 8 is positioned between the latch 7 and the power switch 11 to drive the top power switch 11.

Moreover, a voltage step up circuit 13 is positioned to receive and to translate the square wave signal from the non-overlap circuit 2 to the low side driver circuit 9, which will drive the low power switch 12. The high side and low side drivers 8, 9 provide sufficient driving power capabilities for the half bridge power switches 11, 12, which may be integrated in the half bridge driver IC 1, to turn on or off the half bridge power switches 11, 12, which provide the high voltage square wave to its load as may be specified.

The half bridge driver IC 1 further comprises a bootstrap diode 16 that is connected on one side to a bootstrap capacitor 10, which in turn is connected to the pulse filter 6, the latch 7, the high driver 8, and in between the high transistor 11 and the low transistor 12. On the second side, the bootstrap diode 16 is connected to the low supply generator 14 for supplying voltage to the non-overlap circuit 2, the pulse generator circuit 3, and the step-up circuit 13.

It is important to note that in the present state of the art, low voltage circuits such as the non-overlap circuit 2, the pulse generator circuit 3, and the current sources 4 use a low threshold complementary MOS (CMOS) with a typical 1 Volt threshold. Other circuits and components, such as the pulse filter 6, the latch 7, the high side driver 8, and the low side driver 9 use a double diffused MOS (DMOS) rather than CMOS. DMOS components allow for higher supply of voltage, i.e., 12 Volt, to sufficiently drive the half bridge power switches 11, 12.

Different types of IC components, such as DMOS and CMOS, require more masking steps in the IC manufacturing process making the manufacturing of such a circuit much more expensive than the manufacture of a circuit having components of only one type since the manufacturer's cost is somewhat proportional to the number of masking steps. Furthermore, the non-overlap circuit 2 and the pulse generator circuit 3 are implemented with the low supply generator 14 supplying voltage, e.g., 5 Volt, whereas circuits such as the pulse filter 6, the latch 7, the low side driver 9 and the high side driver 8 are implemented with higher supply voltages, e.g., 12 Volt. A supply generator 14 is required to provide low supply, i.e., 5 Volt, from a higher supply, e.g., 12 Volt. Furthermore, The voltage step up circuit 13 is required to translate signals from the non-overlap circuit 2 to the low side driver circuit 9. Those voltage supply differences make the design and the manufacture of such a circuit complicated, require larger area consumption by the IC, and make the circuit expensive to manufacture.

Finally, an additional problem exists in the pulse filter 6, which is shown in detail in FIG. 2. High threshold voltage P-channel DMOS transistors 20a, 20b are used in the manufacture of the pulse filter 6. Typically, the DMOS FET has a threshold voltage of 3.5 Volt for an N-channel and −5 Volt for a P-channel. In order to turn one of the two P-channel DMOS transistors 20a, 20b on, at least the threshold voltage drop of the transistor 20 is required to be applied across one of the two resistors 21a, 21b connected to the gate of the DMOS transistor. When the voltage drop across resistors 21a, 21b is insufficient to turn on the DMOS transistor, the DMOS will not conduct. Therefore a voltage cannot be created across resistor 22 to turn on one of the inputs to the latch 7. Consequently the latch 7 will not provide the correct output and therefore will not work in the right state. Furthermore, low resistance is desired of both resistors 21a, 21b of the pulse filter 6 to maintain low voltage drop across them in the presence of a large common mode level shifting current arising from dv/dt coupling. On the other hand, high resistance is desired in order to utilize the low differential level shifting current to save power dissipation.

It would be advantageous to have a circuit having sufficient margin of output voltage swing and low differential current input. That circuit is less expensive to manufacture than those presently available and takes minimum footprint area.

SUMMARY OF THE INVENTION

The present invention introduces a low cost half bridge driver IC that overcomes the drawbacks of the prior art. In particular this invention introduces a half bridge driver IC, which is fabricated in the process technology with a minimum or reduced number of masking steps to implement all the blocks and without the use of the low threshold voltage CMOS. The inventive half bridge driver IC uses a universal 12 Volt supply for all the locks with reference to the ground or to the half bridge output. Furthermore, the low differential current from high voltage level shifter transistors of the inventive half bridge driver IC, can provide enough voltage swing to set or reset the latch when high threshold voltage DMOS are used in the pulse filter.

BRIEF DESCRIPTION OF DRAWINGS

The foregoing objects and advantages of the present invention may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE INVENTION

Figure 1:
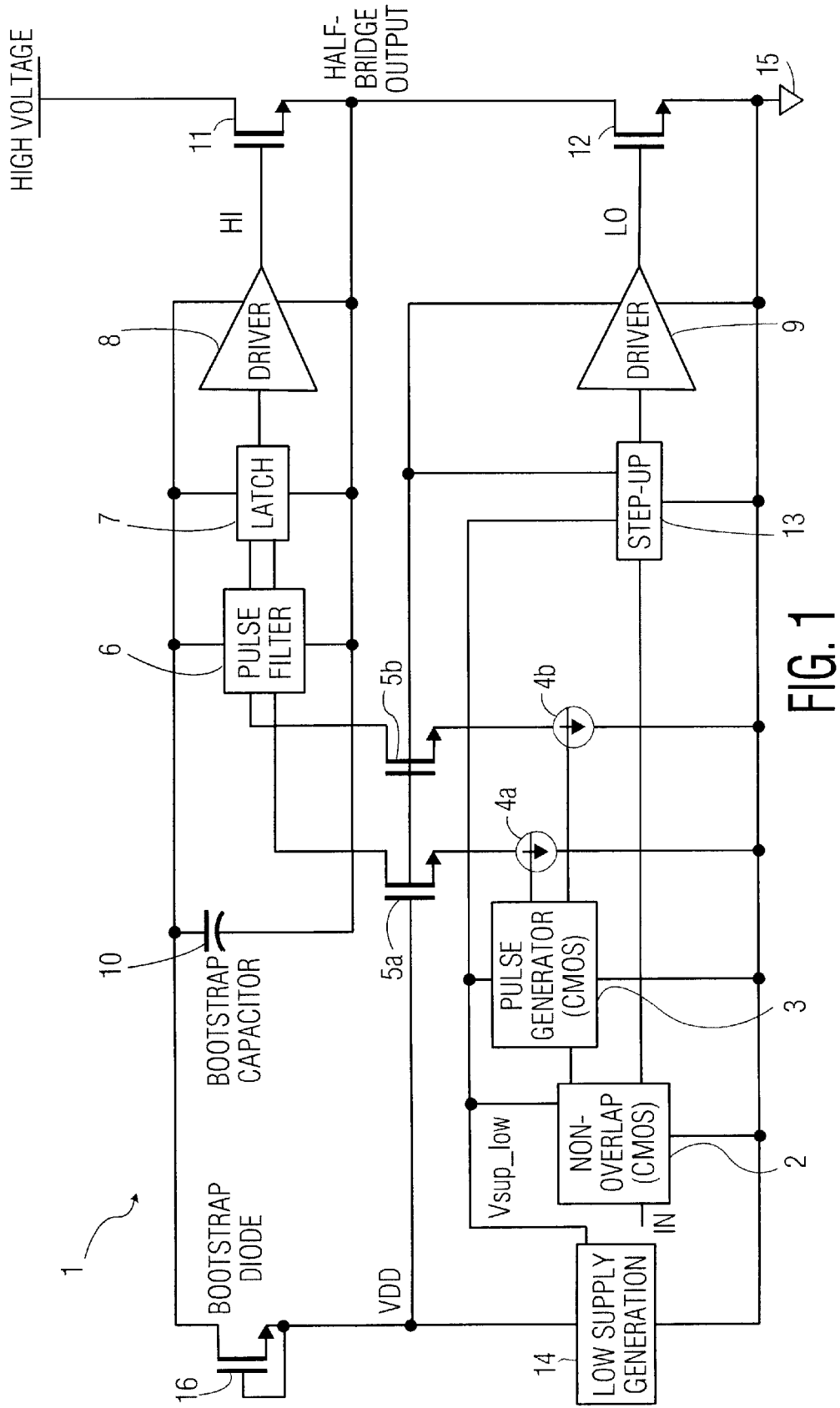
FIG. 1 is a function block diagram of a half bridge driver integrated circuit of the prior art.
Figure 3:
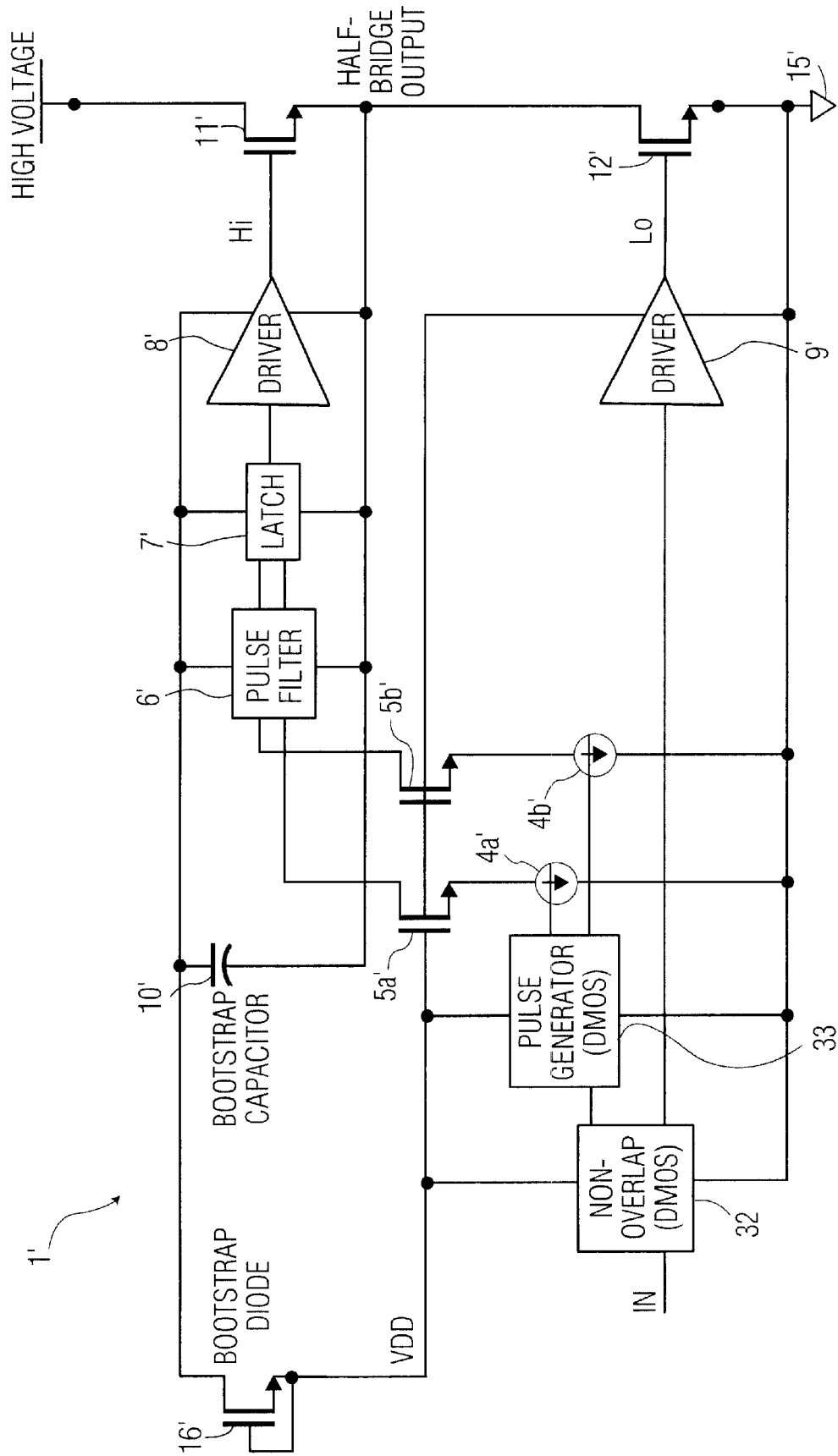
FIG. 3 is a function block diagram of a half bridge driver IC with the capability of using a high threshold voltage DMOS of the present invention.

The present invention reduces the number of masking steps needed to manufacture a half bridge driver IC. FIG. 3 shows the inventive half bridge driver IC 1', wherein a high voltage device structure is fabricated in a thin SOI device layer and elements similar to those of FIG. 1 are identified by like numerals with the addition of a prime mark. The inventive half bridge driver IC 1' allows for higher yield and smaller silicon print area in addition to 30% savings in cost previously achieved in manufacturing of half bridge drivers. The fabrication or construction of such device structure is described in U.S. Pat. Nos. 5,246,870 and 5,300,448, the entire contents of which are incorporated herewith by reference.

The half bridge driver IC 1' of the present invention comprises two, i.e., high and low, transistors 11', 12', a non-overlap circuit 32 to generate two square wave signals to control the timing of conduction time to avoid switching on of both power switches 11', 12' at the same time. The non-overlap circuit 32 is connected to the low side driver circuit 9', which is driving the low power switch 12'. The non-overlap circuit 32 is further connected to a pulse generator circuit 33, which generates two pulses to control the on time switching of the current sources 4a', 4b'. Each of the current sources 4a', 4b' is connected to one of voltage level shifter transistors 5a' 5b', both of which connect to the pulse filter 6'. The pulse filter circuit 6' connects to the latch 7', which is connected to the high side driver 8'. The high side driver 8' drives the high power switch 11' on and off.

The inventive half bridge driver IC 1' further comprises a bootstrap diode 16' that is connected on one side to a bootstrap capacitor 10', which in turn is connected to the pulse filter 6', the latch 7', the high side driver 8', and in between the high transistor 11' and the low transistor 12'. On the second side, the bootstrap diode 16' is connected to the non-overlap circuit 32 and the pulse generator circuit 33. In the preferred embodiment the diode 16' high side supply to the pulse filter 6', the latch 7', and the high side driver 8' is 12 Volt to 0.7 Volt, i.e., diode drop, while the supply for the non-overlap circuit 32, the pulse generator circuit 33, and the low side driver circuit 9' is 12 Volt.

The half bridge IC 1' of the present invention is manufactured entirely without the formation of the CMOS components, e.g., a non-overlap circuit 32 and a pulse generator circuit 33 are formed entirely of the DMOS. Furthermore, a minimum number of masking steps is used in the formation of the inventive half bridge IC 1', due to the fact that no CMOS components need be formed. That is because the devices of the inventive half bridge IC 1' are all the high threshold voltage DMOS devices capable of being biased at high voltage, i.e., up to a few hundred Volt.

In contrast to the CMOS non-overlap circuit 2 (FIG. 1) and the CMOS pulse generator circuit 3 (FIG. 1) of the prior art, which require low supply voltage, e.g., 5 Volt, the half bridge IC 1' of the present invention uses a 12 Volt supply $V_{DD}$ 30 for all of the circuits including the non-overlap circuit 32 and a pulse generator circuit 33, thereby eliminating the need for the low supply generator 14 (FIG. 1) and the step up circuit 13 (FIG. 1). Furthermore, the supply $V_{DD}$ 30 with reference to half bridge output is provided through the bootstrap diode 16' and the capacitor 10' to the floating circuits, such as the pulse filter 6', the latch 7' and the high side driver 8'.

Figure 2:
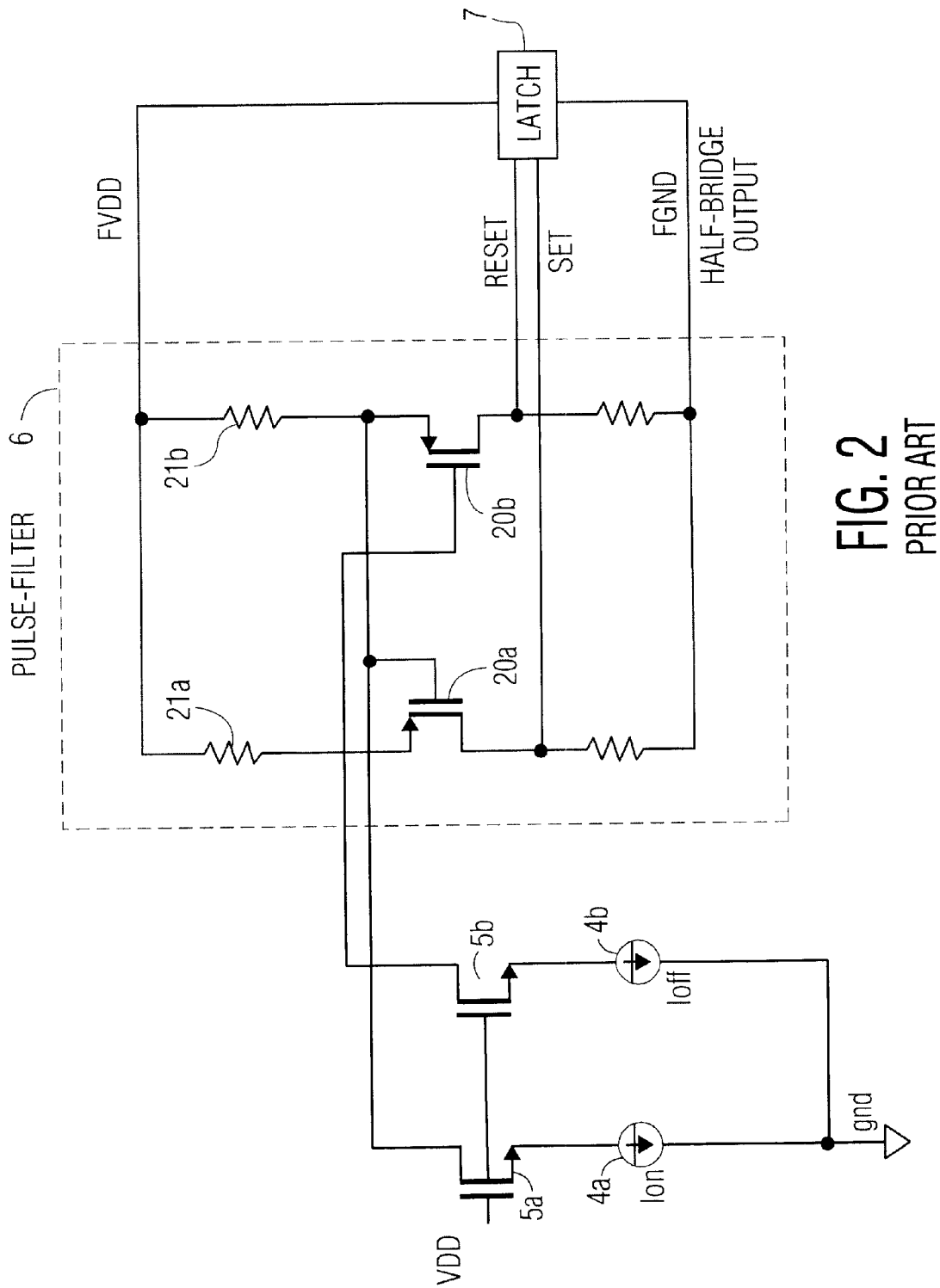
FIG. 2 is a function block diagram of a pulse filter circuit of the prior art.
Figure 4:
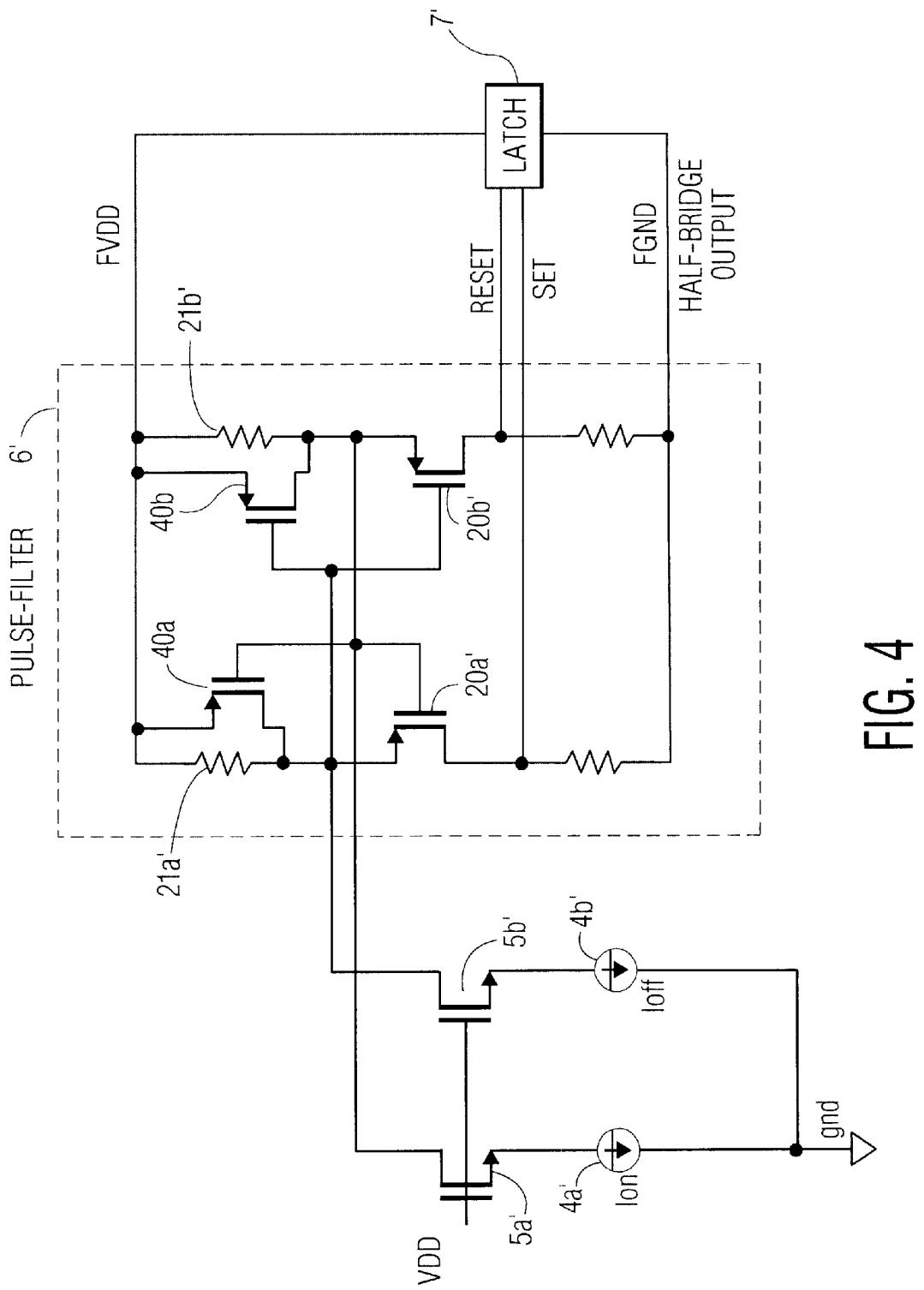
FIG. 4 is a function block diagram of a pulse filter circuit to be included in the half bridge driver IC of FIG. 3.

As can be seen in FIG. 4, wherein elements similar to those shown in FIG. 2 are identified by like numerals with the addition of a prime mark, the cross coupled P-channel DMOS transistors 40a, 40b are coupled in parallel with respective resistors 21a', 21b'. This is done to reduce the necessary differential level shifting current by making resistors 21a', 21b' larger. It may also increase the voltage swing for one of the two inputs to the latch 7' by reducing the effective resistance, since the DMOS impedance parallels the resistor 21a', 21b'.

The P-channel transistor 20a, 20b (FIG. 2) in the pulse filter block 6 (FIG. 2) is required to operate with a high voltage source, e.g., 500 Volt. A transistor with a regular threshold, e.g., 1 Volt, is preferably used with the type of pulse filter circuit shown in FIG. 2. However, no such low threshold voltage P-channel transistor capable of being used with a source of high voltage is available to be utilized with the technology of the present invention. Instead, P-channel DMOS with high threshold voltage, e.g., 5 Volt, are used for transistors 20a', 20b' of the pulse filter circuit 6' shown in FIG. 4. The voltage across each of the resistors 21a', 21b' has to be larger than the DMOS threshold, e.g., 5 Volt, as compared to the regular threshold, e.g., 1 Volt.

One way to solve this discrepancy is to increase the input current sources. This, however, will in turn dramatically increase the undesirable power dissipation of the whole half bridge drive IC. Another approach may be to increase the resistance of the resistor 21a', 21b' while maintaining the same current. Both of these methods will cause a large voltage drop across the resistor 21a', 21b' due to the common mode parasitic current causing the output signal not to have enough swing.

To overcome these problems, the invention increases the resistance, thus reducing the required differential input current and power dissipation, while the output signals, i.e., the set or reset, still have enough voltage swings even with the large common mode parasitic current. That was accomplished by adding an extra pair of P-channel DMOS transistors 40a, 40b and increasing the resistance of resistors 21a', 21b'. One of the pair of transistors 40 is open when the voltage threshold across the parallel resistor is required to be larger than 5 Volt, while the second of transistors 40 is closed to reduce the effective impedance of the resistor paralleled with the DMOS thereby maintaining enough voltage swing of the output.

Figure 5:
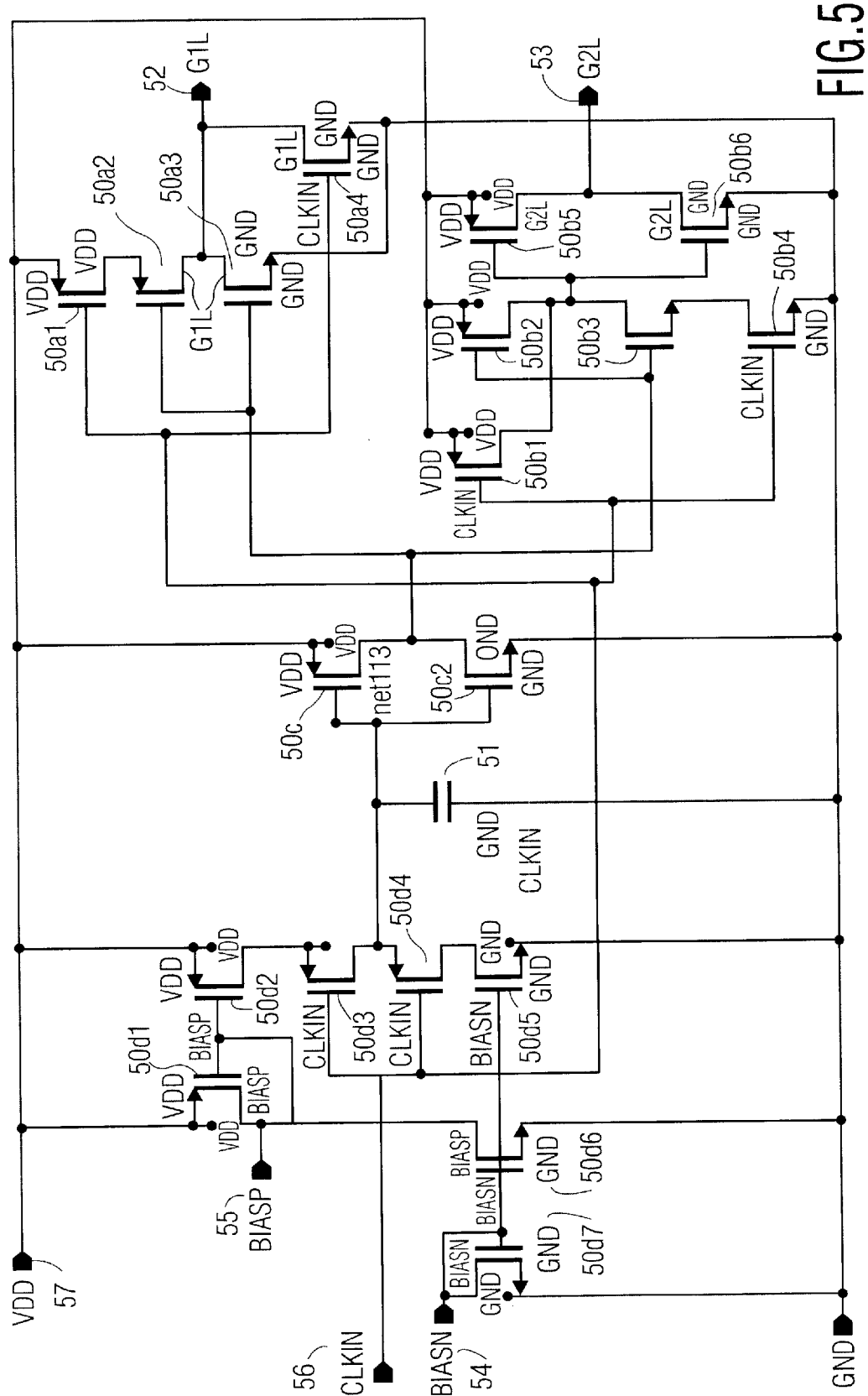
FIG. 5 is a function block diagram of a non-overlap circuit to be included in the half bridge driver IC of FIG. 3.

FIG. 5 shows one embodiment of the inventive non-overlap circuit 32 used to control the timing of the two power transistors' 11', 12' (FIG. 3) conduction time, to avoid both switches being on at the same time. By charging and discharging an on chip capacitor, e.g., 2.5 pF, non-overlap time, e.g., 1.2 uS, can be achieved through adjusting bias current, e.g., 12 uA. Because of different threshold voltages of N and P DMOS, i.e., +3.5 Volt/−5 Volt, a 6:1 ratio of channel width may be chosen, to achieve equal rise and fall time in the inverter. In case a different charge and discharge current is needed, a BIASP pad may be added to adjust the resistance between BIASP and ground to get expected charge current.

Each of the transistors 50 of the non-overlap circuit 32 is shown with three terminals, a gate terminal (G), a source terminal (S), and a drain terminal (D). In one embodiment, the non-overlap circuit 32 comprises 19 transistors 50 and a capacitor 51. A block of transistors 50a is interconnected in a manner where S of the P-channel DMOS transistor 50a1 receives $V_{DD}$ 57 and D of the transistor 50a1 is connected to S of the P-channel DMOS transistor 50a2. D of the transistor 50a2 is connected to D of the N-channel DMOS transistor 50a3 and to D of the N-channel DMOS transistor 50a4. S of the transistors 50a3 and 50a4 is grounded.

A block of transistors 50b is interconnected in a manner where S of the P-channel DMOS transistors 50b1, 50b2 and 50b5 receives $V_{DD}$ 57 and D of the transistor 50b1 is connected to D of the transistor 50b2 and D of the N-channel DMOS transistor' 50b3. S of the transistor 50b3 is connected to D of the N-channel DMOS transistor 50b4 and S of the transistor 50b4 is grounded. D of the transistor 50b5 and D of the N-channel DMOS transistor 50b6 are interconnected and their G is connected to D of the transistors 50b2 and 50b3.

The block of transistors 50d is interconnected in a manner where S of the P-channel DMOS transistors 50d1 and 50b2 receive $V_{DD}$ 57, G of transistors 50d1 and 50b2 are interconnected and further connected to BIASP 55 to which D of the transistor 50d1 is also connected. D of the transistor 50d2 is connected to S of the P-channel DMOS transistor 50d3, and D of the transistor 50d3 is connected to D of the N-channel DMOS transistor 50d4. S of the transistor 50d4 is connected to D of the N-channel DMOS transistor 50d5, and S of the transistor 50d5 is grounded. S of N-channel DMOS transistors 50d6, 50d7 is also grounded, their G and G of the transistor 50d5 are connected to BIASN 54. D of the transistor 50d7 is connected to BIASN 54, while D of the transistor 50d6 is connected to BIASP 55. G of transistors 50d3, 50d4, 50a1, 50a4, and 50b1, 50b4 receive the clock in 56 signal.

In another block, S of the P-channel DMOS transistor 50c1 receives $V_{DD}$ 57 and D is connected to D of the N-channel DMOS transistor 50c2 and to G of transistors 50a2, 50a3, 50b2, and 50b3. S of the transistor 50c2 is grounded. G of transistors 50c1, 50c2 is connected to one terminal of the capacitor 51 and to D of transistors 50d3, 50d4; and the second terminal of the capacitor 51 is grounded.

The first signal 52 of the non-overlap circuit 32 is sent from the interconnection of D of transistors 50a2, 50a3, and 50a4. The second signal 53 is sent from the interconnection of D of transistors 50b5 and 50b6.

Figure 6:
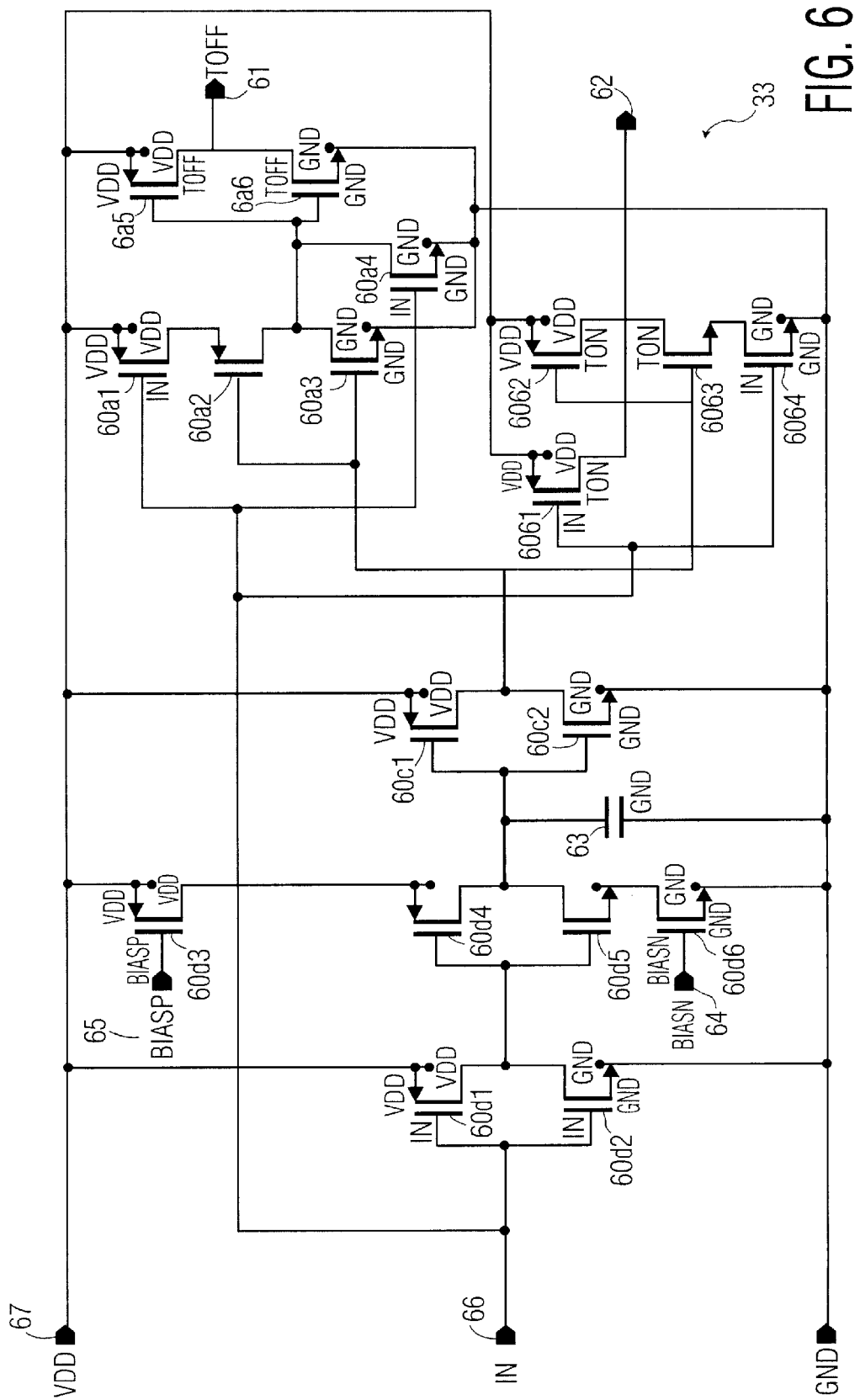
FIG. 6 is a function block diagram of a pulse generator circuit to be included in the half bridge driver IC of FIG. 3.

FIG. 6 shows the inventive pulse generator circuit 33. A first block of transistors 60a is interconnected in a manner where S of the P-channel DMOS transistors 60a1, and 60a5 receives $V_{DD}$ 67, and D of the transistor 60a1 is connected to S of the transistor 60a2. D of the transistor 60a2 is connected to D of the N-channel DMOS transistors 60a3, 60a4 and to G of transistors 60a5 and the N-channel DMOS transistor 60a6. D of transistors 60a5, 60a6 are interconnected and send out the IOFF signal 61

S of P-channel DMOS transistors 60b1, 60b2 receive $V_{DD}$ 67, while their D interconnects with D of the N-channel DMOS transistor 60b3, as well as sends out a signal IOFF 62. S of the transistor 60b3 connects to D of the N-channel DMOS transistor 60b4, S of that transistor being grounded. G of transistors 60a2, 60a3, 60b2, and 60b3 is connected to D of the P-channel DMOS transistor 60c1 and the N-channel DMOS transistor 60c2. S of the transistor 60c1 receives $V_{DD}$ 67; S of the transistor 60c2 is grounded. G of both transistors 60c1, 60c2 is connected to one end of a capacitor 63, the second end of the capacitor 63 being grounded.

Transistors 60d are interconnected in a manner in which, S of the P-channel DMOS transistors 60d1 and 60d3 receives $V_{DD}$ 67, and D of the transistor 60d1 connects G of the P-channel DMOS transistor 60d4, N-channel DMOS transistor 60d5 and to D of the N-channel DMOS transistor 60d2, S of which is grounded. S of the transistor 60d5 interconnects with D of the N-channel DMOS transistor 60d6, which transistor's S is grounded, and G receives BIASIN signal 64. D of the transistor 60d5 is connected to D of the transistor 60d4 and also to the first end of capacitor 63. S of the capacitor 60d4 is connected to D of the transistor 60d3. G of the transistor 60d3 receives the BIASP signal 65. G of 60d1, 60d2, 60a1, 60a4, 60b1, 60b4, receives the "in" signal 66.

Both circuits 32 (FIG. 5) and 33 are implemented in the N-channel and P-channel DMOS to avoid the use of the CMOS circuitry. However other components in the minimum or reduced number of masking steps process such as lightly doped drain (LDD) devices and bipolar junction transistors may also be used to replace the CMOS.

While the invention has been particularly shown and described with respect to illustrative and preferred embodiments thereof, it will be understood by those skilled in the art that changes in form and details may be made therein without departing from the spirit and scope of the invention, which is limited only by the scope of the appended claims.

Having thus described our invention, what we claim as new, and desire to secure by Letters Patent is:

1. A half bridge driver integrated circuit formed with circuit components all of which are made out of DMOS, said integrated circuit comprising:

first and second transistors serially connected and coupled to terminals of a source of supply voltage, a non-overlap circuit comprising a first at least one capacitor and a first plurality of transistors, said first at least one capacitor and said first plurality of transistors being formed from DMOS; and a pulse generator circuit coupled to the non-overlap circuit for generating voltage pulses, said pulse generator circuit comprising a second at least one capacitor and a second plurality of transistors, said second at least one capacitor and said second plurality of transistors being formed from DMOS.

2. The integrated circuit of claim 1, further comprising a pulse filter circuit coupled to the first transistor and having at least one transistor, said at least one transistor being coupled in parallel with at least one resistor, said pulse filter circuit operative to reduce a differential level shifting current and to increase output voltage.

3. The integrated circuit of claim 2, further comprising a power supply for supplying voltage to each internal circuit block of said integrated circuit, said voltage being within one diode drop for each said internal circuit block.

4. The integrated circuit of claim 3, wherein a threshold voltage of said non-overlap circuit and of said pulse generator circuit is greater than +2.5 Volt for a N-channel transistor and less than −2.5 Volt for a P-channel transistor.

5. The integrated circuit of claim 3, further comprising: at least one level shift transistor for switching current to said pulse filter, said at least one level shift transistor having an associated current source, said current source being controlled by said pulse generator circuit;

a N-channel DMOS bootstrap diode connected to a bootstrap capacitor by its drain terminal and to said at least one level shift transistor by its source terminal;

a latch, said latch receiving signals from said pulse generator and connecting to a high side gate driver, said high side gate driver driving a high side power transistor; and said non-overlap circuit connecting to said pulse generator circuit and to a low side gate driver, said low side gate driver driving a low side N-channel DMOS transistor.

6. The integrated circuit of claim 1 further comprising:

a level shift transistor and associated current source coupled to said pulse generator circuit and to a pulse filter circuit, said current source being controlled by the pulse generator circuit, a high side driver and a low side driver coupled to said pulse filter circuit and to said non-overlap circuit, respectively, wherein said non-overlap circuit, said pulse generator circuit, said level shift transistor, said pulse filter circuit and said high side driver and low side driver are all formed from DMOS.

7. The integrated circuit of claim 6 wherein said non-overlap circuit, said pulse generator circuit, said level shift transistor, said pulse filter circuit and said high side driver and low side driver all operate from a same power supply.

8. The integrated circuit of claim 1 further comprising a high side driver and a low side driver coupled to said first and second transistors, respectively, and said non-overlap circuit, said pulse generator circuit and said high side driver and low side driver are all formed out of DMOS.

9. The integrated circuit of claim 8 wherein the non-overlap circuit is coupled to the low side driver circuit without the interposition of a voltage step up circuit.

10. The integrated circuit of claim 1 wherein a single power supply is directly coupled to the non-overlap circuit and the pulse generator circuit and via a bootstrap diode to a pulse filter circuit and to a high side driver circuit, wherein the high side driver circuit is coupled to the pulse filter circuit.

11. The integrated circuit of claim 2 wherein the pulse filter circuit further comprises;

at least one further transistor connected in series circuit with the parallel circuit of said at least one transistor and said at least one resistor, an output terminal of said at least one further transistor being coupled to an input of a bistable latch circuit, wherein said at least one transistor and said at least one further transistor are each formed from DMOS.

12. The integrated circuit of claim 8 wherein the non-overlap circuit is coupled to a low side driver circuit without the interposition of a voltage step up circuit.

13. The integrated circuit of claim 8 wherein said non-overlap circuit, said pulse generator circuit, and said high side driver and low side driver all operate from a single power supply.

14. The integrated circuit of claim 13 further comprising;

a pulse filter circuit formed from DMOS and comprising at least one transistor coupled in parallel with at least one resistor, and at least one further transistor connected in series circuit with the parallel circuit of said at least one transistor and said at least one resistor.

15. The integrated circuit of claim 1 further comprising a single power supply for supplying voltage to each internal circuit block of said integrated circuit.

16. The integrated circuit as claimed in claim 1 wherein all transistors of the half bridge driver integrated circuit are formed from DMOS.

17. The integrated circuit as claimed in claim 7 wherein said power supply is a 12 volt power supply.

18. A high voltage half bridge driver integrated circuit, wherein all of the components of said integrated circuit are formed from DMOS, said integrated circuit comprising:

a first gate driver connected to a low side gate and to a high voltage non-overlap circuit;

a pulse generator circuit connected to said non-overlap circuit, said pulse generator circuit sending voltage pulse signals;

at least one current source, said at least one current source connected to said pulse generator and to a level shifter transistor, said level shifter transistor receiving current from said at least one current source;

a pulse filter circuit having an input connected to said level shifter transistor, said pulse filter circuit having an output being connected to a latch;

a second gate driver connected to a high side gate, said second gate driver being connected to said latch; and a bootstrap diode connected to a ground level power supply and to a floating power supply.

19. The integrated circuit of claim 18, wherein a threshold voltage of said non-overlap circuit and of said pulse generator circuit is greater than +2.5 Volt for a N-channel transistor and less than −2.5 Volt for a P-channel transistor.

20. The integrated circuit of claim 18, wherein said pulse filter circuit comprises at least one transistor, said at least one transistor being coupled in parallel with a resistor to reduce a differential level shifting current.

* * * * *